(12) United States Patent
Uerpmann et al.

(10) Patent No.: US 11,940,464 B2
(45) Date of Patent: Mar. 26, 2024

(54) OPTICAL PROBE FOR PROCESS RAMAN SPECTROSCOPY AND METHOD OF USE

(71) Applicant: Kaiser Optical Systems Inc., Ann Arbor, MI (US)

(72) Inventors: Carsten Uerpmann, Saint Cyr au Mont d'Or (FR); Michael Gordon Stidham, Ann Arbor, MI (US)

(73) Assignee: Endress+Hauser Optical Analysis, Inc., Ann Arbor, MI (US)

( * ) Notice: Subject to any disclaimer, the term of this patent is extended or adjusted under 35 U.S.C. 154(b) by 0 days.

(21) Appl. No.: 17/431,850

(22) PCT Filed: Feb. 14, 2020

(86) PCT No.: PCT/US2020/018247
§ 371 (c)(1),
(2) Date: Aug. 18, 2021

(87) PCT Pub. No.: WO2020/172055
PCT Pub. Date: Aug. 27, 2020

(65) Prior Publication Data
US 2023/0194568 A1    Jun. 22, 2023

Related U.S. Application Data

(60) Provisional application No. 62/807,022, filed on Feb. 18, 2019.

(51) Int. Cl.
*G01R 1/067* (2006.01)
*G01N 21/65* (2006.01)

(52) U.S. Cl.
CPC ......... *G01R 1/06755* (2013.01); *G01N 21/65* (2013.01)

(58) Field of Classification Search
CPC ............... G01R 1/06755; G01N 21/65; G01N 2021/8411; G01N 2021/8528; G01N 21/8507
See application file for complete search history.

(56) References Cited

U.S. PATENT DOCUMENTS 10,209,191 B2    2/2019    Rugnone

OTHER PUBLICATIONS

Wegert, "Device for visually investigating a borehole", machine translation of foreign patent document EP3173577 (Year: 2017).*

(Continued)

*Primary Examiner* — G. M. A Hyder
(74) *Attorney, Agent, or Firm* — Christopher R. Powers; Endress+Hauser (USA) Holding, Inc.

(57) ABSTRACT

One aspect of the present disclosure discloses a probe, including a probe body having a center axis defining a proximal end and a distal end and including an aperture in the distal end; a window affixed in the aperture, wherein the window is substantially optically transparent; and a flange adjoining the proximal end of the probe body, the flange including a sealing surface and a sealing edge, wherein the flange separates an in-process portion of the probe from an ex-process portion of the probe, the in-process portion including at least the probe body, the sealing surface and the sealing edge, where at least the in-process portion of the probe consists essentially of an austenitic stainless steel material. Further aspects include a computer product configured to execute a method employing the probe.

16 Claims, 9 Drawing Sheets

(56) References Cited

OTHER PUBLICATIONS

Anonymous:"Stainless Steel Grade 310 MoLN (UNS S31050)", Mar. 7, 2013 (Mar. 7, 2013), XP093079728, Retrieved from the Internet: URL:https://www.azom.com/article.aspx?ArticleID=8281(Retrieved on Sep. 7, 2023).

* cited by examiner

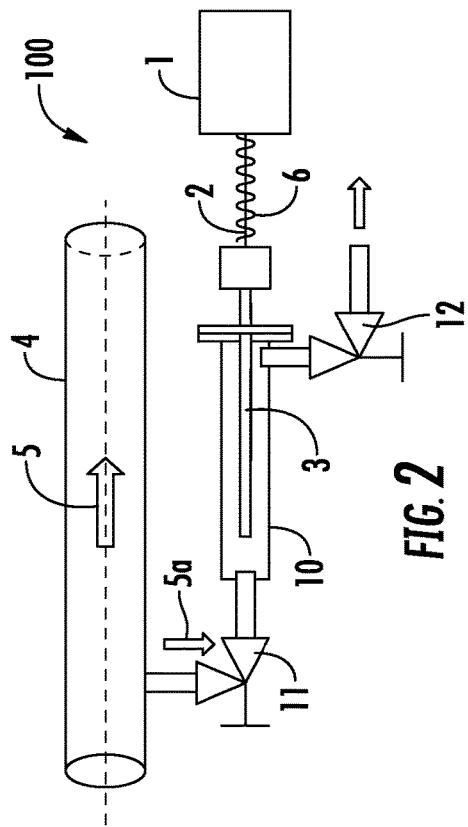
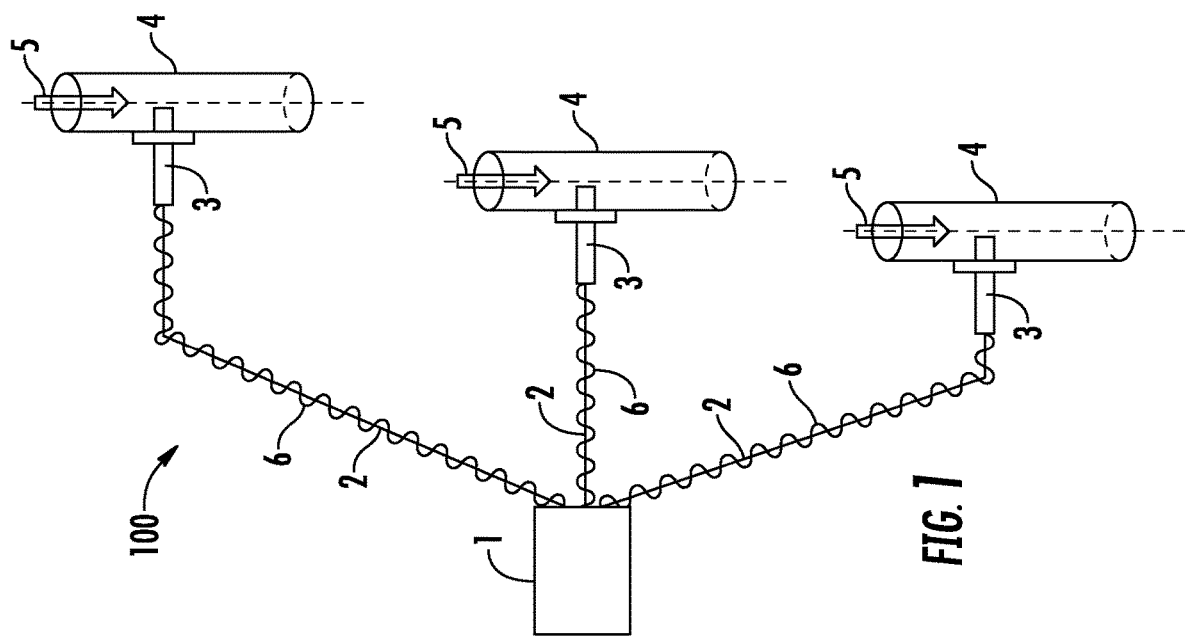
FIG. 2
FIG. 1

OPTICAL PROBE FOR PROCESS RAMAN SPECTROSCOPY AND METHOD OF USE

CROSS-REFERENCE TO RELATED APPLICATIONS

The present application is related to and claims the benefit priority of International Patent Application No. PCT/US2020/018247, filed on Feb. 14, 2020, and U.S. Provisional Patent Application No. 62/807,022, filed Feb. 18, 2019, the entire contents of which are incorporated herein by reference.

TECHNICAL FIELD

The present disclosure generally relates to laser spectroscopy and, in particular, to an optical probe assembly for laser spectroscopy.

BACKGROUND

Raman spectroscopy is a type of laser spectroscopy based on the effect known as Raman scattering. Raman scattering is a type of inelastic scattering of electromagnetic radiation, such as an excitation light from a laser, when traversing a medium. The effect can be summarized as follows. Most of the incident photons of the excitation light undergo elastic scattering (termed Rayleigh scattering) resulting in the scattered radiation having the same frequency as the incident radiation. A minority of the incident photons, however, undergo inelastic scattering resulting in emitted photons having lower or higher energy, thus leading to frequencies above and/or below the incident radiation.

The inelastic scattering is caused by a selective interaction between the incident radiation and molecules in the medium, which is specific for each form of chemical bond. The frequency shift observed in the inelastically scattered radiation provides information about the composition of the medium, for example, the concentration of a specific molecule. The relatively weak inelastically scattered light may be separated from the relatively intense Rayleigh scattered light by filtering the incident radiation frequency, and the inelastically scattered light is collected to generate information about the composition of the medium.

Raman spectroscopy has become a powerful tool for use in conjunction with in situ process analysis. Sophisticated fiber-optic coupled Raman probes are currently used for process sampling in various industries, including polymer, chemical, petrochemical, food and beverage, pharmaceutical, biopharmaceutical and other life science industries. However, certain processes include extreme process conditions, including high temperature, high pressure and corrosive environmental conditions, that conventional spectroscopic probes cannot withstand over long-term use. Further, because conventional optical probes are not capable of withstanding certain process conditions, methods of analysis have not previously been developed for Raman-based analysis in situ of such processes.

Accordingly, there remains a need for further contributions in this area of technology.

SUMMARY

One aspect of the present disclosure includes a probe, comprising: a probe body having a center axis defining a proximal end and a distal end and including an aperture in the distal end; a window affixed in the aperture, wherein the window is substantially optically transparent; a flange adjoining the proximal end of the probe body, the flange including a sealing surface and a sealing edge, wherein the flange separates an in-process portion of the probe from an ex-process portion of the probe, the in-process portion including at least the probe body, the sealing surface and the sealing edge; and a collar adjoining the flange opposite the probe body in the ex-process portion of the probe, wherein the probe body, flange and collar define an inner volume therethrough, the inner volume configured to accommodate an optic cable such that the optic cable can pass through the probe body, flange and collar as to be in optically communication with the window, and wherein at least the in-process portion of the probe consists essentially of an austenitic stainless steel material.

In an embodiment, the austenitic stainless steel material meets ASTM UNS S31050 or AISI 310 MoLN. In a further embodiment, the austenitic stainless steel material meets EN X1CrNiMoN25-22-2 or EN 1.4466. In an embodiment, the probe body, flange and collar are manufactured of the same austenitic stainless steel material. In an embodiment, the probe body, flange and collar form one, integral part. In a further embodiment, the ex-process portion of the probe consists essentially of type 316 steel material.

In certain embodiments, the probe further comprises: a main body having a distal end and a proximal end, the main body defining a channel therethrough, wherein the channel is configured to accommodate at least the proximal end of the probe body into the proximal end of the main body, the channel further configured to enable an optic cable to pass into the main body and connect to the probe body; and a process connection affixed to the main body at or near the proximal end of the main body, the process connection configured to enable the probe, in assembly, to be attached to a process connector of a process, wherein the flange of the probe seats against the process connection, and wherein the probe is reversibly attached at or near the proximal end of the main body such that the probe body extends from the main body. In a further embodiment, the probe further comprises a fiber connection including an interlock connected to the distal end of the main body and configured to reversibly attach an optic cable to the probe.

In an embodiment, the sealing surface is adapted to seal against a complementary surface of a process container or of a flow cell configured to accommodate the probe body. In certain embodiments, the window is composed of sapphire.

A further aspect of the present disclosure includes a method for in-line quantitative analysis of at least one process stream of a urea synthesis process. The method uses a spectroscopic system, comprising: a narrow band light source adapted to generate excitation light of a suitable wavelength; an optical probe, the probe including: a probe body having a center axis defining a proximal end and a distal end and including an aperture in the distal end; a window affixed in the aperture, wherein the window is substantially optically transparent; a flange adjoining the proximal end of the probe body, the flange including a sealing surface and a sealing edge, wherein the flange separates an in-process portion of the probe from an ex-process portion of the probe, the ex-process portion including at least the probe body, sealing surface and sealing edge; and a collar adjoining the flange opposite the probe body, wherein the probe body, flange and collar define an inner volume therethrough, the inner volume configured to accommodate an optic cable such that the optic cable can pass through the probe body, flange and collar and be in optically communication with the window, and wherein at least the in-process portion of the probe consists essentially of an austenitic stainless steel material. The spectroscopic system further comprises a spectrometer configured to generate Raman spectra from scattered light conveyed to the spectrometer via the probe, the spectrometer including a detector; an optic cable in optical communication between the probe and the spectrometer; and a processor configured to control the spectroscopic system and to process and analyze the Raman spectra.

The method includes generating the excitation light using the light source and transmitting the excitation light via the probe to a process sample of at least one process stream of a urea synthesis process; detecting the scattered light with the detector of the spectrometer via the probe and processing the scattered light to generate a Raman spectrum; modeling the Raman spectrum using a chemometric model, the model including a conversion of a spectroscopy band corresponding to excitation of the carbonyl di-amide bond and of a spectroscopy band corresponding to excitation of the atomic bonds in the carboxyl form, the modeling performed using the processor; and determining a concentration of urea in the at least one process stream using Raman spectroscopy based on the modeled excitation of the carbonyl di-amide bond, wherein the concentration in the at least one process stream of carbon-containing molecules other than urea and having a carboxyl group is determined by Raman spectroscopy as the equivalent concentration of carbon dioxide corresponding to the excitation of the atomic bonds in the carboxyl form, the determining performed using the processor, wherein urea is synthesized from ammonia and carbon dioxide using the urea synthesis process at a pressure in the range of 100 to 300 bar and temperature in the range of 50 to 250° C.

In an embodiment, the excitation of the carbonyl di-amide bond of molecules of urea is detected from a Raman shift of the excitation light in a frequency range of 900 to 1050 $cm^{-1}$; and wherein the molecules other than urea are detected from a Raman shift of the excitation light in a frequency range of 1000 to 1150 $cm^{-1}$. In an embodiment, the processor is further configured to determine a concentration of ammonia from a Raman shift of the excitation light in a frequency range of 1350 to 1750 $cm^{-1}$.

A further aspect of the present disclosure includes a computer program product comprising a non-transitory, computer-readable medium storing instructions stored thereon that, when executed by at least one programmable processor, cause the at least one programmable processor to perform a Raman spectroscopic analysis by performing the operations of the method. In an embodiment, the stored instructions include instructions for performing an operation including determining a concentration of ammonia from a Raman shift of the excitation light in a frequency range of 1350 to 1750 $cm^{-1}$.

BRIEF DESCRIPTION OF THE DRAWINGS

The described embodiments and other features, advantages and disclosures contained herein, and the manner of attaining them, will become apparent and the present disclosure will be better understood by reference to the following description of various embodiments of the present disclosure taken in junction with the accompanying drawings, wherein:

FIG. 1 is a schematic view of an embodiment of a system for performing a method of the present disclosure;

FIG. 2 is a schematic view of a further embodiment of a system for performing the method of the present disclosure;

DETAILED DESCRIPTION

Figure 3:
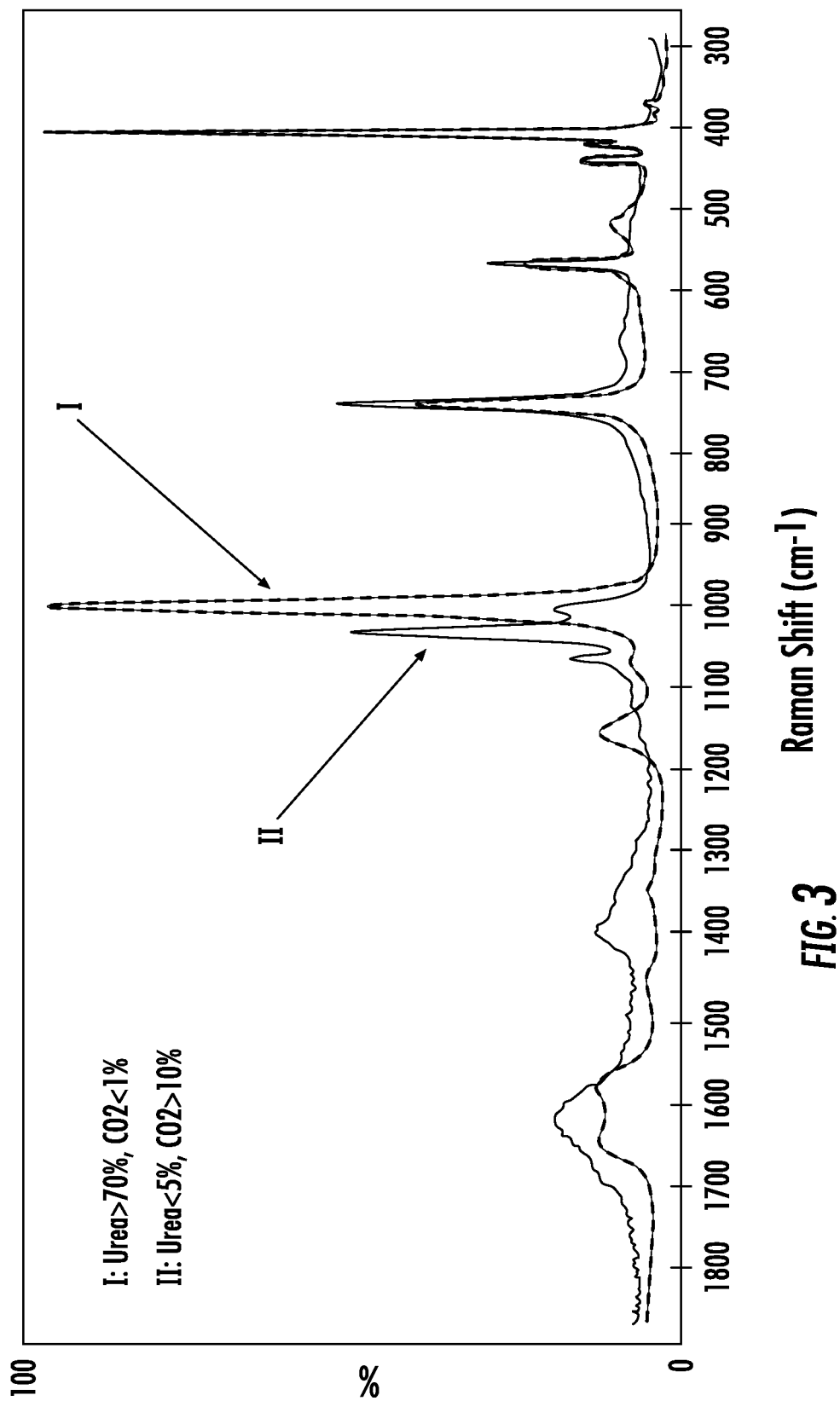
FIG. 3 is a plot of spectra of two process streams having different concentrations of urea and carbon dioxide.

The present disclosure discloses various embodiments of an optical probe and methods for using and constructing the same. The present disclosure further discloses various embodiments of methods and models for in-line quantitative analysis of process streams involved in the synthesis of urea in a production plant starting from ammonia and carbon dioxide at high pressure and high temperature. According to one aspect of the present disclosure, an optical probe configured for Raman spectroscopy and adapted for the high-pressure, high-temperature and corrosive process conditions of a urea synthesis process is disclosed.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

Urea may be synthesized from ammonia and carbon dioxide. An overview of the related processes can be found in the Ullmann's Encyclopedia of Industrial Chemistry, 5th ed., vol. A27, par. 3.3. Several process streams may be involved in the urea synthesis process, which is highly sensitive to their composition, in particular, to the concentration of reactants, such as ammonia and carbon dioxide, and to the concentration of water which is detrimental to the yield at equilibrium. Parameters which strongly influence the process include, for example, the ammonia to carbon molar ratio, the water to carbon molar ratio, and the carbon conversion to urea. Hence, the reactants concentration should be controlled in a tight range ideally to obtain the optimum performance and the maximum yield.

One urea synthesis process for the industrial production of urea is the known total recycle technology. Alternatively, the urea synthesis may be performed according to the known stripping technology. Main components of a stripping plant include a high-pressure synthesis reactor, a stripper, a carbamate condenser and possibly a scrubber, which together form a high-pressure loop, and one or more recovery sections operating at a lower pressure. The process streams include, for example, the effluent of the reactor, of the carbamate condenser or of the scrubber, the concentrated solution leaving the stripper, and the low-pressure carbamate solution from the lower-pressure recovery sections.

An efficient synthesis process requires monitoring the composition of the process streams for a better understanding and optimization of the process and to ensure a proper control of the plant. A conventional monitoring technique consists in the off-line analysis of samples of one or more selected process streams. For example, a sample of a pressurized process stream is extracted in a known amount of water to dissolve the gases that are generated by the depressurization from the reactive environment, then the sample is analyzed in a separate laboratory. However, this technique has several drawbacks. Sampling of the stream must be performed by highly trained personnel due to safety reasons and is intrinsically affected by mistakes due to easy loss of volatile compounds. Off-line analysis introduces a time delay between the sampling and the analysis, being unsuitable to a timely control of the process, which is under continuous evolution. Another disadvantage is that the extraction of the sample causes a sudden change of thermodynamic parameters and affects the equilibrium and concentration of the evolving medium. Consequently, the composition of the sample and the result of the analysis may be affected.

Accordingly, there is an incentive to perform in-line analysis to get real-time data of the process stream concerned. However, in-line analysis is challenging due to the corrosive nature of ammonium carbamate and transient products involved in the synthesis of urea and due to the elevated temperature and pressure, particularly in the high-pressure loop. For example, the solution leaving the reactor is typically under supercritical conditions.

Prior attempts to perform in-line analysis include the use of a gas chromatographic technique for monitoring the gas phase from the reactor. The chromatographic technique however is only applicable when the reactor has an independent outlet gas line. Moreover, the information about the composition of the gas phase has been found unsuitable for in-line control of a production plant because the formation of ammonium carbamate and formation of urea through the subsequent dehydration of carbamate evolve in the liquid phase. Another drawback is that the gas chromatographic technique requires expensive maintenance.

Another conventional technique is to implement a process control mainly dependent on the ammonia to carbon molar ratio (N/C), which is indirectly measured as a function of density. Density can be measured in a conventional, relatively simple way, and the N/C ratio has a linear dependence on density in a very narrow range of temperature and pressure. Hence, as long as the temperature and pressure are within a certain range, the N/C ratio can be estimated with acceptable accuracy, and the technique is regarded as reliable.

The ratio between the moles of ammonia and carbon in the reactive mixture, however, is only one of the parameters that actually govern the process. For example, the aforementioned technique is not able to provide information about the water to carbon ratio or the converted carbon to urea. In addition, the N/C ratio is only measured via a model based on density readings. The model is tuned for a narrow range of density and hence the accuracy may be affected when the actual density, depending on temperature and pressure, is outside the narrow range or is close to the boundary values.

Another problem encountered in the control of a recycle urea process is the possible cascade effect caused by a change of a composition of a process stream. For example, the performance of the reactor is influenced by the composition of the carbamate recycle stream from the lower pressure recovery section while simultaneously the composition of the recycle stream is also dependent on the composition of the urea solution at the outlet of the high-pressure stripper that is feeding the recovery unit. However, the described conventional control system is not able to take this behavior into account. Hence, there is still the need of a method for in-line detecting of detailed information concerning the composition of media involved in the urea synthesis to solve the aforementioned problems.

The present disclosure solves these problems and provides a method, model, probe and system for an improved quantitative analysis and improved control and optimization of an industrial urea synthesis process in a plant. The present disclosure includes an application of Raman spectroscopy to the in-line quantitative analysis of streams of a urea synthesis process and an optical probe adapted to withstand the harsh conditions of the urea synthesis process.

One aspect of the present disclosure is a method of in-line quantitative analysis of at least one process stream of a urea synthesis process where urea is synthesized from ammonia and carbon dioxide, characterized by the use of Raman spectroscopy for the in-line quantitative analysis, including a computational model validated to convert Raman spectroscopic data into process compositions (e.g., ammonia, carbon dioxide, urea) and key performance indicators (e.g., conversion percentage, N/C ratio, hydrogen/carbon molar ratio). The method, probe and model may be applied to a high-pressure and high-temperature synthesis process. Further, the method, probe and model may be applied to a urea process where synthesis pressure is 100 to 300 bar and temperature is 50 to 250° C. Hence, at least one process stream may have a pressure and temperature in the above ranges.

The Raman spectroscopy of streams of urea process according to the present disclosure may be carried out with a narrow band light source, such as a laser diode or light-emitting diode. Excitation light emitted by the light source is focused in a region of the process stream to be analyzed. In certain embodiments, the light source may be in the visible or near-visible range. In certain embodiments, the light source is monochromatic. The visible range is generally understood as wavelengths of 390 to 700 nanometers (nm). The near-visible range is generally understood as wavelengths between 300 nm and 1.4 microns ($\mu$m). In at least one embodiment, the method is performed with a monochromatic light source having a wavelength between 300 and 1400 nm or further between 400 and 1000 nm. For example, an embodiment the system of the present disclosure includes a laser light source of 785 nm.

Applicant has found that the molecules involved in the synthesis of urea, including urea, ammonium carbamate, carbonate and hydrogen carbonates, and ammonia, provide selective and distinguishable Raman scattering. The system and method of the present disclosure uses Raman spectroscopy to gather quantitative information about the concentration in weight terms (e.g., wt %) of the target molecules. The method of the present disclosure can be used to determine the concentration of at least one of urea, carbon dioxide, and/or ammonia contained in the process stream.

A further aspect of the present disclosure is a modeling of the chemistry of the solutions (e.g., chemometrics), which is of advantage for the application of Raman spectroscopy. Accordingly, the chemistry is modeled with reference to the following components: 1) a first component denotes the form of converted carbon in the carbonyl di-amidic formula; a second pseudo-component denotes all forms of unconverted carbons, such as carbamate, carbonate and hydrogen carbonate, etc. assumed as equivalent mono component; a third pseudo-component denotes all forms of nitrogen not belonging to the urea molecule, free as ammonia or combined as ammonium hydroxide, or in the salts forms as ammonium carbonate, hydrogen carbonate and carbamate.

In the following description, the first component is referred to as urea, the second component is referred to as carbon dioxide, and the third component is referred to as ammonia. The above chemometric model may be applied to any process stream, for example, to a solution effluent from the reactor or from the stripper.

Applicant has found that the urea concentration can be associated with a characteristic Raman band corresponding to the excitation of the carbonyl di-amide bond. The carbonyl di-amide bond is found in the molecule of urea and is targeted in the present disclosure to distinguish urea from other forms of non-converted carbon, such as carbon dioxide. Other forms of non-converted carbon behave differently to the Raman scattering being the atomic bonds within the molecule mostly in the carboxyl form (carbonate, hydrogen carbonate and carbamate). The method of the present disclosure includes detecting the concentration of urea in a process stream using detection of a spectroscopic band corresponding to excitation of the carbonyl di-amide bond. The concentration of carbon-containing molecules other than urea (non-converted carbon) can be determined as an equivalent concentration of carbon dioxide corresponding to the excitation of the atomic bonds in the carboxyl form.

According to one aspect of the present disclosure, these components may be detected as follows: the first component (e.g., "urea") may be identified by excitation of the carbonyl di-amide bond with a Raman shift of a suitable incident excitation light in the frequency range from 900 to 1050 $cm^{-1}$; the second component (e.g., "carbon dioxide"), including the non-converted forms of carbon, has been found to be Raman-reactive more particularly from 1000 to 1150 $cm^{-1}$; the third component (e.g., "ammonia"), including other forms of nitrogen (other than urea), may be detected by Raman excitation in a frequency range from 1350 to 1750 $cm^{-1}$. The frequency ranges are indicated in $cm^{-1}$ as per common practice in the spectroscopy art. The incident excitation light may have a wavelength of around 785 nm.

In a complex mixture where urea and ammonium carbamate are blended together, the foregoing frequency ranges identify all the nitrogen forms in the sample, including those belonging to the urea molecule. The third pseudo-component ("ammonia") may be detected by subtracting the first component ("urea") contribution to the signal intensity once the concentration of the first component is known by its specific frequency.

The method can be applied to any industrial process for synthesis of urea at high pressure and high temperature including, but not limited to, total recycle processes and to stripping processes, such as $CO_2$-stripping and self-stripping. In an embodiment, the method is applied to processes where synthesis of urea takes place at a pressure in the range 100-300 bar and temperature in the range 50-250° C.

According to an embodiment, the Raman analysis may be performed directly on a main process stream. In such an embodiment, a suitable probe is installed directly on the main process pipe concerned. According to other embodiments, the analysis can also be performed on a side stream taken from a main process pipe. Such an embodiment may provide safer and easier inspection and maintenance of the system. In such an embodiment, the analysis system may include a sampling chamber.

Another aspect of the invention is a method for controlling a plant for the synthesis of urea according to the attached claims. The method for controlling a urea synthesis process makes use of Raman spectroscopy for real-time analysis of the composition of at least one, and in certain embodiments, more streams of the process. The process can be any known urea process for industrial production, including the stripping and non-stripping processes.

A further aspect of the present disclosure is an apparatus for control and optimization of a urea synthesis plant according to the attached claims. Information provided by the Raman spectroscopy analysis may be used for controlling and optimize automatically the plant.

An apparatus of the present disclosure may include one or more probes, wherein the probe or each of the probes is disposed as to focus excitation light from a light source to a focus region, the focus region including at least one of the process streams, and to capture and return the Raman scattered light.

At least one probe may be a high-pressure optical probe adapted to focus the excitation light in the outlet stream from the synthesis reactor, in the outlet urea solution stream from the high-pressure stripper, and in the carbamate recycle stream from the recovery section to the synthesis unit. Each probe may be connected to a spectroscopic analyzer via a fiber optic cable connection.

A distinct advantage of the present disclosure is the in-line quantitative detection of the composition of streams involved in the urea synthesis and collection of real time information about the process performance, not only in terms of molar ratio ammonia to carbon but also in terms of water to carbon ratio and converted carbon to urea.

The present disclosure further enables an improved optimization of the plant compared to prior art systems by continuously monitoring the composition of convenient process streams, which are bonded to each other by the cascade effect, permitting the real-time control of the plant to anticipate worsening effects that may be expected due to composition and parameter changes of the fundamental streams. The related benefits include improvement of the overall stability of the process, minimization of the risk of shut down, increase of the yield of conversion, and reduced energy consumption and reduced pollutants.

FIG. 1 illustrates a spectroscopic system 100 according to an embodiment of the present disclosure including a control unit 1 and a plurality of probes 3 with suitable, corresponding optic cables 2. The probes 3 may be mounted on selected process pipes 4 of a urea plant, each process pipe 4 carrying a corresponding process stream 5. The process pipes 4 may be pipes or lines, for example, to the high-pressure synthesis loop or to the recovery section of a urea plant. In such an embodiment, the process streams 5 may include urea, water, ammonia, ammonium carbamate, carbon dioxide and possibly other chemical compounds involved in the synthesis process.

For example, the process pipes 4 may include one or more of: an effluent pipe of a reactor (e.g., carrying an aqueous solution of urea, unconverted carbamate and free ammonia), an effluent pipe from a high-pressure stripper, or a pipe of recycle carbamate at the delivery of a high-pressure pump. The process streams 5 may have an elevated temperature and pressure. For example, the process streams 5 may have pressures of up to 300 bar and a temperature of up to 250° C.

Figure 11:
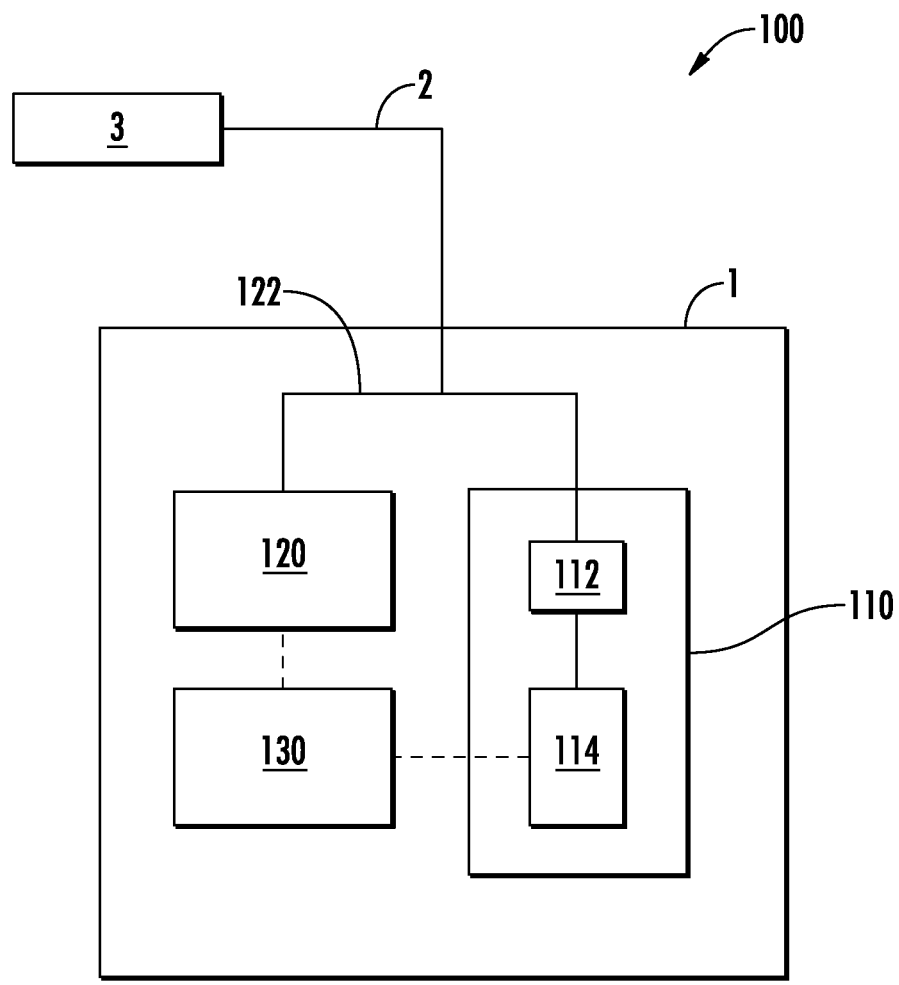
FIG. 11 shows a schematic view of a control unit of the system of FIG. 1 according to the present disclosure.

In at least one embodiment of the present disclosure, as shown in FIG. 11, the control unit 1 may include a spectrometer 110 optically connected to the optical probe 3 via the optic cable 2. The spectrometer 110 may include optical components 112 and a detector 114 configured to receive and detect the scattered light from the optical probe 3 via the optic cable 2. The optical components 112 may include one or more lenses, filters, beam splitters mirrors and/or diffraction gratings configured and arranged to direct only the Raman scattered light to the detector 114. In certain embodiments, the control unit 1 may include a conventional spectrometer adapted to perform Raman spectroscopy. In at least one embodiment, the control unit 1 may include a suitable Raman spectroscopic analyzer.

The control unit 1 may further include an excitation light source 120, for example, a laser emitter, as described further herein, the light source 120 in optical communication with the probe 3 via the optic cable 2. In certain embodiments, the control unit 1 may include an internal optic cable 122 in optical communication with the optic cable 2. Alternatively, in certain embodiments, the internal optic cable 122 may be a proximal end of the optic cable 2.

The control unit 1 may further include a controller 130 configured to process and analyze scattered light received by the detector 114 from the probe 3. The controller 130 may be further configured to control the system 100 and spectrometer 110 to perform the method of the present disclosure and to analyze the data (e.g., spectra) generated by the system 100 per a model of the present disclosure to perform the method. The controller 130 may be in communication with a control system of the urea plant (not shown).

The controller 130 may be configured to perform certain operations as described further herein and may be a portion of a processing subsystem that includes one or more computing devices having memory, processing, and/or communication hardware. The controller 130 may be a single device or a distributed device, and the functions of the controller 130 may be performed by hardware and/or software. The controller 130 can include one or more Arithmetic Logic Units (ALUs), Central Processing Units (CPUs), memories, limiters, conditioners, filters, format converters, or the like which are not shown to preserve clarity. In an embodiment, the controller 130 is programmable to execute algorithms and processes data in accordance with operating logic that is defined by programming instructions, such as software or firmware. Alternatively or additionally, operating logic for the controller 130 can be at least partially defined by hardwired logic or other hardware, for example, using an Application-Specific Integrated Circuit (ASIC) of any suitable type. As understood by those having skill in the art and the benefit of the present disclosure, the controller 130 can be exclusively dedicated to performing the operations of the disclosed methods or may be further used in the regulation, control, and activation of one or more other subsystems or aspects of the system 100.

For each process stream 5 shown in FIG. 1, an excitation light 6 emitted by the control unit 1 is conveyed to a focus region (e.g., a focus point) of the probes 3 in the process stream 5 via the fiber optic cables 2. The focus region is formed by the probe 3 such that the excitation light 6 is incident upon the medium (e.g., fluid or gas) of the respective process stream 5. Then, in accordance with the Raman effect, most of the incident excitation light 6 undergoes elastic scattering (e.g., Rayleigh scattering), such that these scattered light will have the same wavelength of the incident ones. A minor part of the excitation light 6 undergoes Raman scattering and, consequently, will exhibit a wavelength/ frequency shift. The degree of the shift depends on the composition of the streams 5. A portion of the scattered light are conveyed back from the probe 3 to the main control unit 1 via the optic cable 2 as a signal. The spectroscopic analyzer of the control unit 1 separates the inelastically scattered light, which defines a Raman signal, from the elastically light and detects the Raman signal. The intensity and wavelength of the detected Raman signal is processed by spectroscopic analyzer, which may be integrated in the control unit 1, to measure the concentration of target compounds, for example, urea, carbon dioxide and ammonia.

FIG. 2 illustrates a further embodiment of the present disclosure in which an analysis of the Raman signal is performed on a side stream 5a of the medium under test. In such an embodiment, the system 100 includes a sampling chamber 10 connected to the process pipe 4 via an admission valve 11. The probe 3 is mounted on the chamber 10. The side stream 5a is taken from the process pipe 4 and conveyed to the chamber 10 via a valve 11. The analysis (e.g., the Raman analysis) may be performed on the medium contained in the chamber 10 using the same method as described with respect to FIG. 1. Subsequently or continuously, the medium can be discharged from the chamber 10 via a discharge valve 12 to a lower pressure section of the plant, to a waste outlet or to any suitable location. Such an embodiment of the system 100 may be less invasive to the process and/or the process pipe 4. The chamber 10 enables the system 100 to be safely accessed via the valve 11, without affecting the operation of the process pipe 4 and, broadly, the urea plant.

FIG. 3 shows plots of an exemplary Raman analysis including a first spectrum I, which relates to a sample containing more than 70% urea and less than 1% of pseudo-component $CO_2$ (as defined herein), and a second spectrum II, which relates to a sample containing less than 5% urea and more than 10% of pseudo-component $CO_2$. The plots show urea bands at around 1000 $cm^{-1}$ and a $CO_2$ band (sample II) at around 1050 $cm^{-1}$. The bands at around 1400 and 1650 $cm^{-1}$ relative to the pseudo-component "ammonia" are also clearly visible.

In at least one embodiment according to the present disclosure, a logic algorithm implemented in the control unit 1 may generates signal to plant actuators controlling the stream 5 to optimize operation of the urea plant and the efficiency of the urea synthesis process based on the Raman analysis.

A disturbance in the composition of the urea solution at high-pressure stripper outlet due to deviation of the operating parameters may impact with a dynamic the composition of the carbamate recycle stream and again, after a certain dynamic, the performance of the reactor and its outlet composition. For example, if a deviation in the composition at the stripper outlet is detected, the logic algorithm can act to prevent a carbamate composition change and ultimately affect the reactor performance.

Example

An experimental study on process streams in an industrial plant for the production of urea was performed. The process streams were selected to contain different concentrations of urea, carbon dioxide and ammonia and were subjected to the same analytical procedure as per the following. The optical probe 3 (described further herein) and a 785 nm laser light source were used. Though a laser light of 785 nm was selected in this experimental example, the method of the present disclosure could be also extended to other monochromatic laser lights as mentioned above. The optical probe 3 was connected to the spectroscopic analyzer of the control unit 1 through approximately 5 meters of fiber optic cable 2.

A sample was placed into a glass recipient of 10 ml volume. A light shielding system was applied to isolate the sample from the environmental light contamination. One-minute exposures were acquired for each sample using the detector of the spectroscopic analyzer, and the measure of each sample was repeated for at least 5 times. The above procedure was used to acquire spectra, such as those shown in FIG. 3, the acquired spectra clearly showing the peaks corresponding to urea and to the pseudo-component of $CO_2$.

Figure 4:
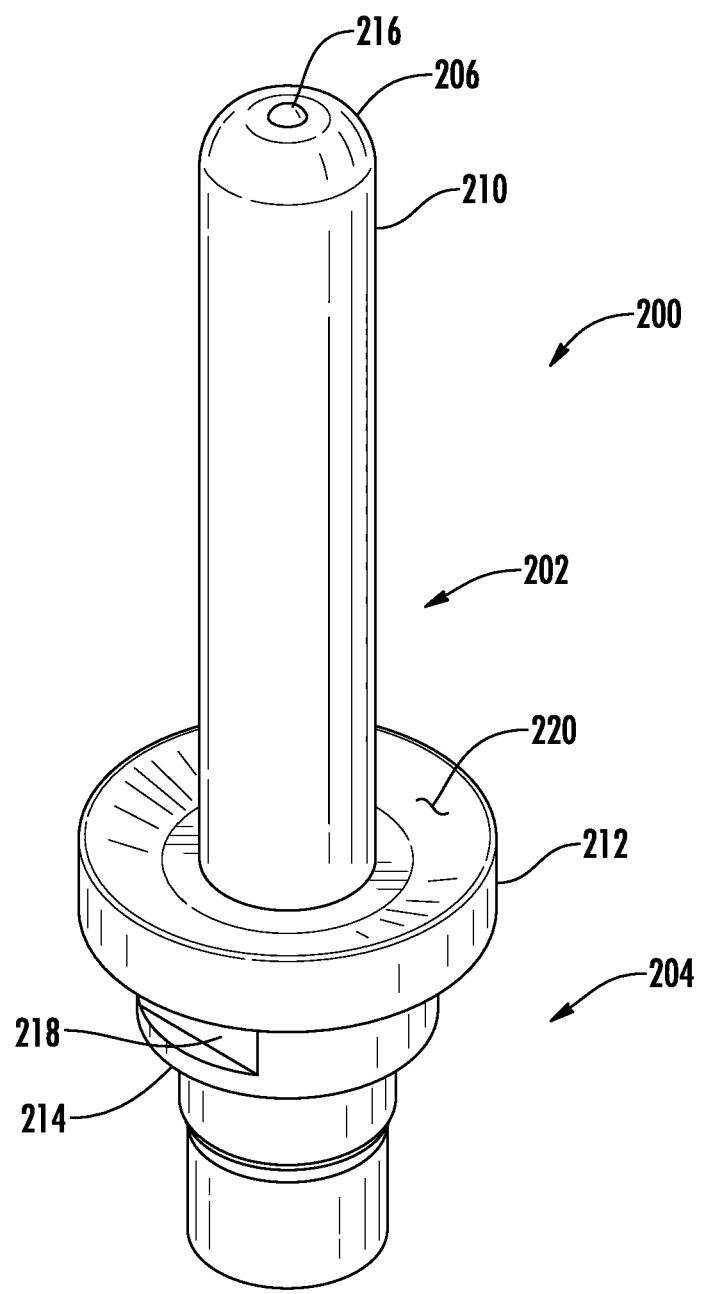
FIG. 4 shows a perspective view of an optical probe according to the present disclosure.

FIG. 4 shows an optical probe 200 according to at least one embodiment of the present disclosure. In at least one embedment, the optical probe 200 is adapted for Raman spectroscopy and may be employed in the system 100 for the probe 3 of FIGS. 1 and 2. As shown in FIG. 4, the optical probe 200 includes an ex-process (i.e., out of process) portion 204 and an in-process 202 portion separated by a flange 212 having a probe sealing surface 220. The ex-process portion 204 may include a wrench flat 218 in a collar 214, the wrench flat 218 configured for a complementary tool, thereby facilitating installation of the probe 200 in a probe assembly.

The in-process portion 202 includes an elongated probe body 210 ending in a probe tip 206 at a distal end of the probe body 210. The optical probe 200 may include internal optics and optical interfaces (not shown) adapted to aim the excitation light conveyed by an optic cable 340 (shown in FIG. 5A) at the focus region in the process or process sample under test and to transmit scattered light from the focus region back through the optical probe 200 and optic cable 2 to the control unit 1.

The optical probe 200 includes a window 216 mounted in an aperture in the probe tip 206. The window 216 is adapted to transmit the excitation light emitted by the light source of the control unit 1 and communicated via the optic cable 2 to the optical probe 200. The window 216 is further adapted to transmit scattered light to be analyzed from the process through the optical probe 200 to the control unit 1 of the system 100 via the optic cable 2 for processing and analysis. The window 216 may be compression bonded to probe tip 206, without a braze, solder, welding filler, or other sealant compound that would compromise corrosion resistance of the optical probe 200.

The window 216 is substantially optically transparent at least to the excitation light and Raman scattered light. For example, the window 216 may be transparent to visible, near-infrared and/or infrared light of the light source. In an embodiment, the window 216 may be a sapphire window. In certain embodiments, the window 216 may be composed of glass (i.e., amorphous glass), glass-ceramic (i.e., at least partially crystalline glass), diamond, crystalline quartz, silicon, germanium, gallium nitride (GaN) crystals, AlN crystals, optical metamaterial, transparent ceramic such as sapphire (i.e., single-crystal aluminum oxide), magnesium aluminate spinel ($MgAl_2O_4$), aluminum oxynitride spinel ($Al_{23}O_{27}N_5$, often referred to as AlON), or other suitably transparent, and combinations of two or more of these materials.

The window 216 may be adapted for operating conditions of at least 160 bar and at least 185° C. In further embodiments, window 216 may be adapted for operating conditions with pressures in the range 100-300 bar and temperatures in the range 50-250° C. The window 216 may include a coating or treatment thereon, including an anti-reflective, hydrophobic, oleophobic and/or a repellency coating or treatment. For example, in an embodiment, the window 216 may include a glass repellency treatment manufactured by Aculon Company.

Figure 5A:
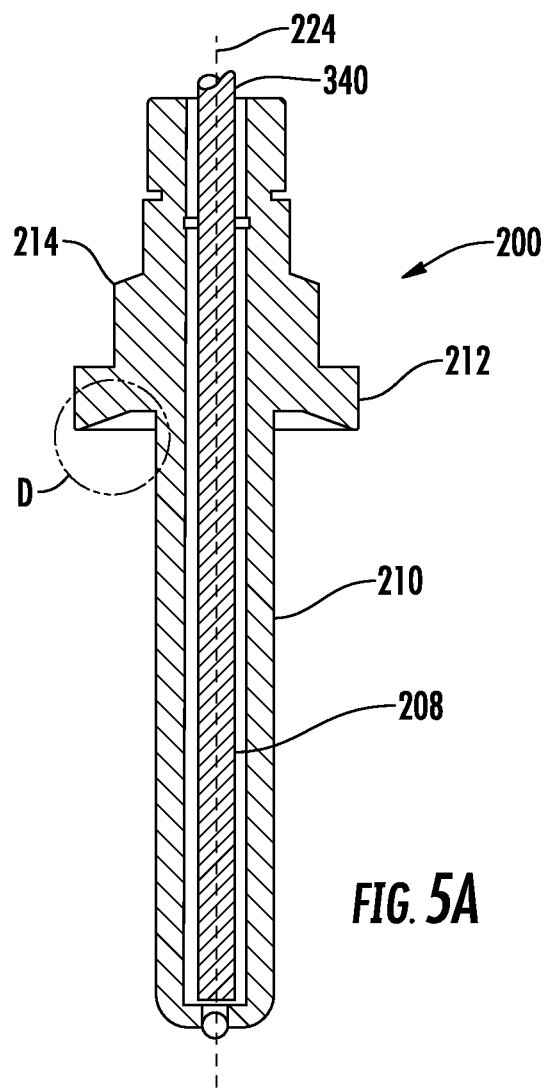
FIG. 5A shows a cross-sectional view of the optical probe assembly of FIG. 5 taken at line A-A.

FIG. 5A shows a cross-sectional view along a central axis 224 of the optical probe 200. As shown in FIG. 5A, in certain embodiments, probe body 210, flange 212 and collar 214 may be manufactured to form one, integral part. In alternative embodiments, the probe body 210, flange 212 and collar 214 may consist of one or more separate parts and assembled together.

The probe body 210 defines an inner volume 208 within the probe body 210, the inner volume 208 configured to accommodate the optic cable 340. In certain embodiments, the inner volume 208 is further defined through the flange 212 and collar 214, as shown in FIG. 5A, thereby enabling the optic cable 340 to pass through the optical probe 200 and optically communicate with the window 216. In at least one embodiment, the optic cable 340 is a separate piece of optical fiber from the optic cable 2, which have an interface connection configured to ensure optical communication between the optic cable 340 and the optic cable 2. In a further embodiment, the optical cable 340 is a distal portion of the optic cable 2.

Figure 5B:
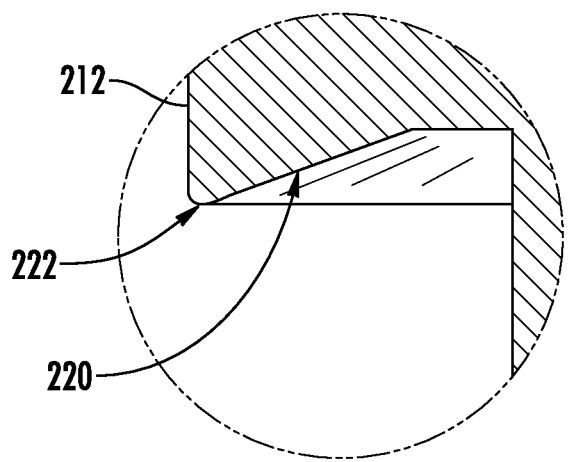
FIG. 5B shows a detail view of the optical probe at Detail D of FIG. 5A.

FIG. 5B is a detail, cross-sectional view at Detail D of FIG. 5A of the flange 212 of the optical probe 200, in which the probe sealing surface 220 and a sealing edge 222 of the flange 212 are detailed. As shown in FIG. 5B, in an embodiment, the sealing surface 220 may be angled relative to the flange 212 and the probe body 210. In further embodiments, the sealing surface 220 may have any suitable profile for mating with and seating against a complementary sealing surface, as described further herein.

Figure 6:
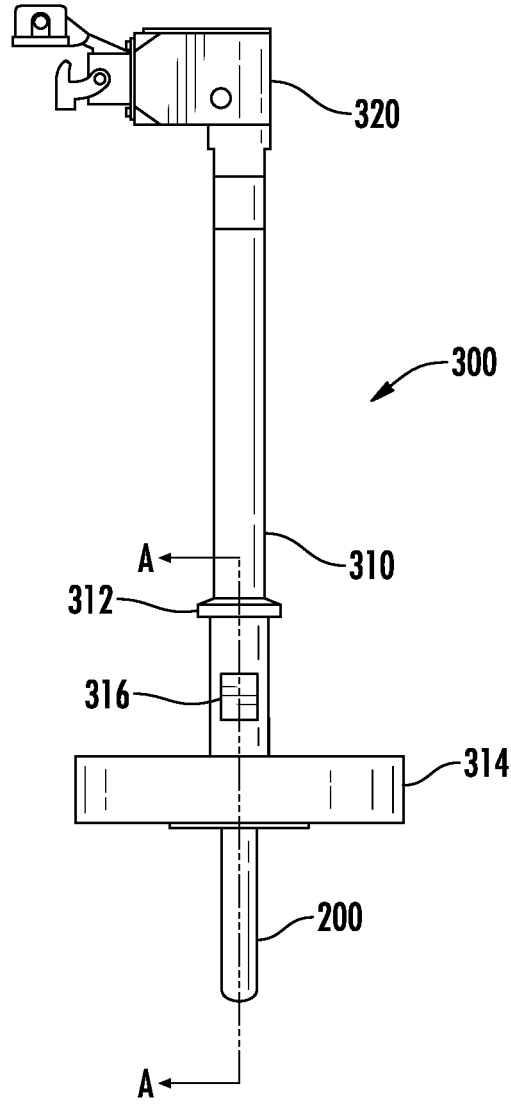
FIG. 6 shows a side view of a probe assembly of the present disclosure.

FIG. 6 shows a probe assembly 300 according to at least one embodiment of the present disclosure. As shown in FIG. 6, the probe assembly 300 includes the optical probe 200. The probe assembly 300 may include a main body 310 that is connected to a process connection flange 314 at a proximal end of the main body 310 and a fiber connection 320 at a distal end. The process connection flange 314 may be configured to facilitate connecting the probe assembly 300 to a process container, such as the process pipe 4, as shown in FIG. 1. In embodiments of the present disclosure, the process container may be the process pipe 4, a reactor vessel, a reactor chamber, a measuring chamber or any relevant subsystem of an industrial process plant, for example, a urea plant.

The main body 310 defines an inner channel (not shown) in which at least the ex-process portion 204 of the optical probe 200 may be disposed and through which the optic cable 340 may pass from the fiber connection 320 to the optical probe 200, thereby enabling connecting the optic cable 340 to the optical probe 200 within the inner channel. The probe assembly 300 and the optical probe 200 may each be formed as separate, seamless, integral bodies to minimize or eliminate weld seams.

The fiber connection 320 may include a fiber interlock 322 configured to secure the optic cable 2 of the system 100 in optical communication with the optical probe 200. The fiber connection 320 may further include an interlock indicator 324 configured to indicate to an operator when the fiber interlock 322 has properly secured the optic cable 2 in the fiber connection 320, thereby signaling when the light source is in optical communication with the optical probe 200. In at least one embodiment, the optic cable 340 is a separate piece of optical fiber from the optic cable 2, which have an interface in the fiber connection 320, which is configured to ensure optical communication between the optic cable 340 and the optic cable 2. In a further embodiment, the optic cable 340 is a distal portion of the optic cable 2, and the fiber connection 320 is configured to route the optic cable 2 to the optical probe 200.

At or near the proximal end, the main body 310 may include a flange stop 312 and a region adapted to facilitate assembly of the optical probe 200 into the probe assembly 300. For example, the region may include a wrench flat 316, as shown in FIG. 6.

As shown in FIG. 6, the probe body 210 of the optical probe 200 may extend from the ex-process portion of the main body 310 of the probe assembly 300 and into the process to be analyzed. In such an embodiment, the probe body 210 extends into the process such that the excitation light 6 is transmitted into the process at the focus region and such that scattered light from the process is directed from the focus region through the window 216 to the control unit 1 via the optic cable 2 or optic cables 2, 340.

Figure 7:
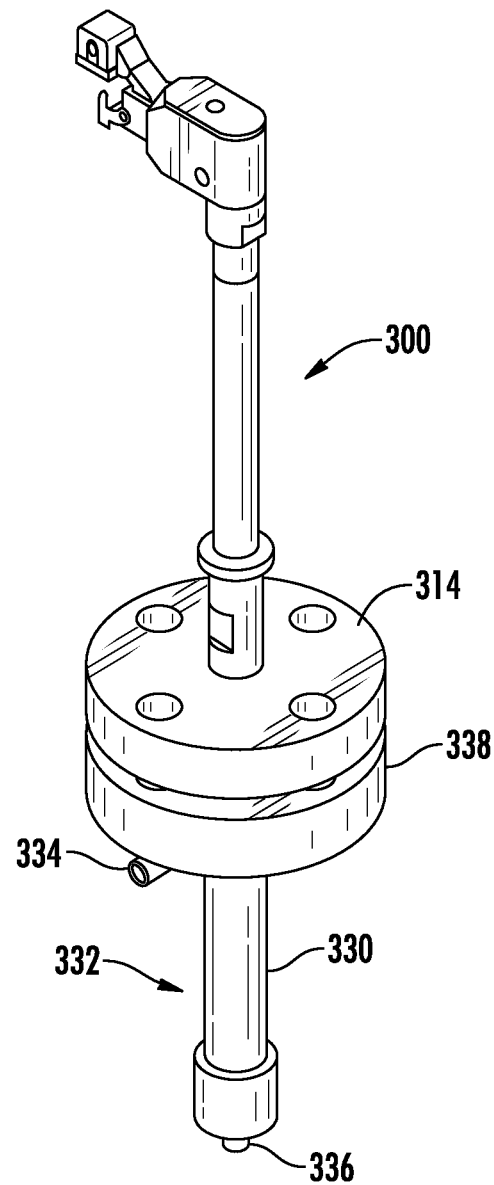
FIG. 7 shows a perspective view of a probe assembly according to the present disclosure.

In certain embodiments, the probe body 210 with window 216 may extend into a measuring chamber 332 of an in-process flow cell 330 configured to interface of the probe assembly 300 as shown, for example, in FIG. 7. The flow cell may include an inlet 334 to the measuring chamber 332 and an outlet 336 from the measuring chamber 332.

Figure 8A:
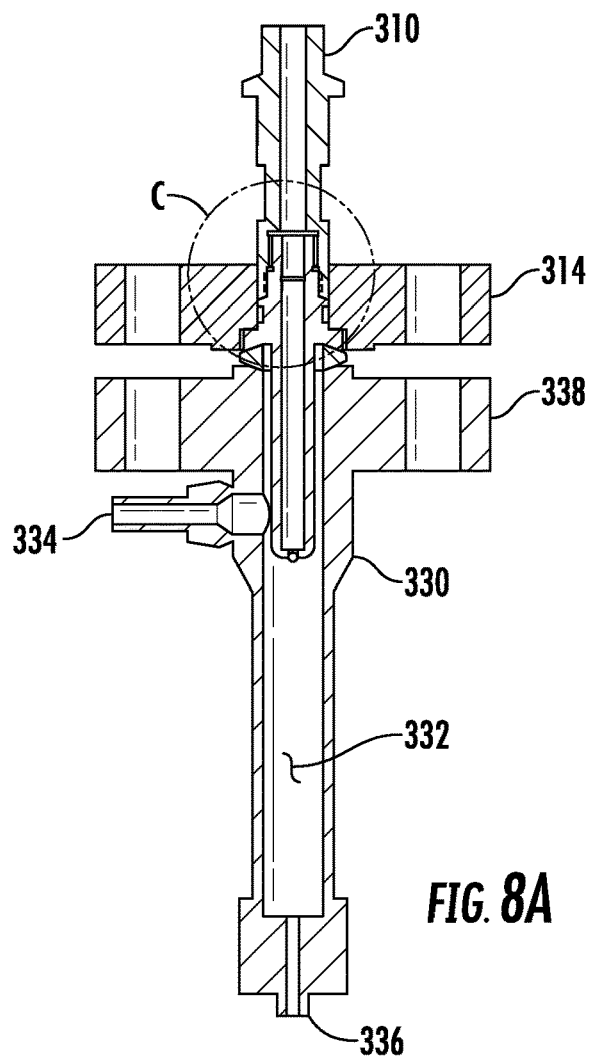
FIG. 8A shows a cross-sectional view of a portion of the probe assembly of FIG. 6 taken at line A-A.

FIG. 8A shows a cross-sectional view along line A-A of a segment of the probe assembly 300, including the flow cell 330 with the measuring chamber 332, the optical probe 200, and a segment of the main body 310. The flow cell 330 may be disposed in the process (e.g., in-process) and in communication with the process such that process constituents (e.g., process reactants and/or products) can flow into and out of the measuring chamber 332 via the inlet 334 and the outlet 336, respectively. The outlet 336 may be in communication with the process or an alternative process stream. In certain embodiments, the outlet 336 may be in communication with a waste line such that samples from the measuring chamber 332 are not directed back into the process. In certain embodiments, the measuring chamber 332 at least may be in fluid communication with the process such that a sample from the process is conveyed to the measuring chamber 332 such that the sample is representative of the temperature, pressure and constituents of the process. In a further embodiment, the measuring chamber 332 may be integral with and defined within an in-process portion of the probe assembly 300.

The flow cell 330 may further include a process connection 338. In at least one embodiment, the process connection 338 may be configured to facilitate attaching the flow cell 330 to a process container (not shown). In such an embodiment, the process connection 338 may be structured to interface with the process connection 314 of the probe assembly 300 with a wall of the process container in between, as shown in FIG. 8A. For example, the wall of the process container may be sandwiched between the process connection 338 of the flow cell 330 and the process connection 314 of the probe assembly 300 such that the main body 210 of the optical probe 200 passes through an aperture in the wall. In such an embodiment, the process connection 338 and the process connection 314 are sufficiently sealed to the process container as to prevent process media from the process container, which may be at high temperate and high pressure, from leaking around the flow cell 330 to the ex-process side and the environment.

Figure 8B:
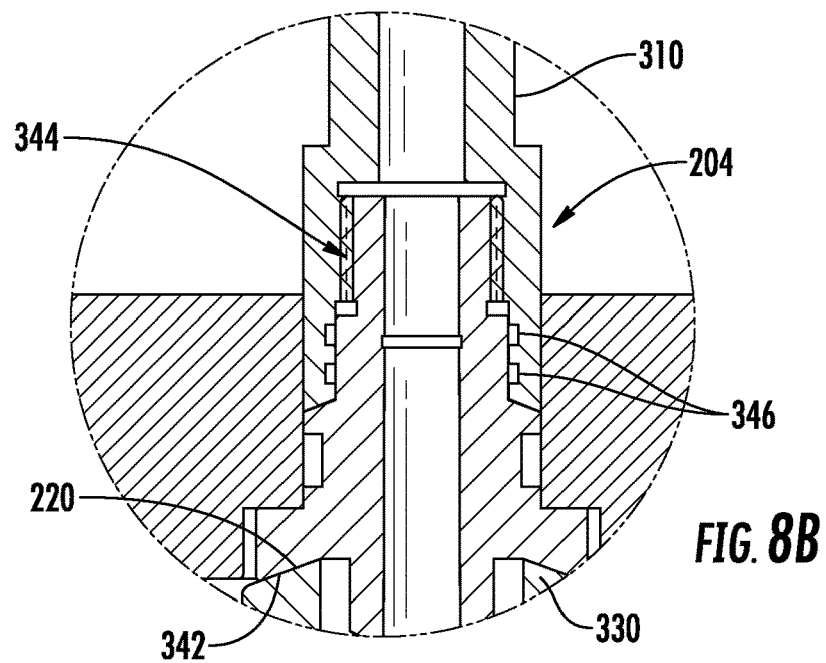
FIG. 8B shows a detail view of the probe assembly at Detail C of FIG. 8A.

FIG. 8B shows a detail, cross-sectional view at Detail C of an exemplary interface between the main body 310 of the probe assembly 300, ex-process portion 204 of the probe 200 and the flow cell 330. In an embodiment, as shown in FIG. 8B, the optical probe 200, at or near the proximal end of the probe body 210, and the main body 310, at its proximal end, may include complementary and mating threads 344 such that the optical probe 200 may be attached to the main body 310 by engaging the complementary and mating threads of each. The optical probe 200 may further include seals 346 configured to isolate the ex-process and in-process portions of the probe assembly 300. The seals 346 are structured to prevent media from the process container, which may be at high temperate and high pressure, from leaking through the probe assembly 300 to the ex-process side and the environment.

As shown in FIG. 8B, in assembly, the sealing surface 220 of the optical probe 200 may seat and seal against a complementary sealing surface 342 of the flow cell 330. In such an embodiment, sealing surface 220 and sealing surface 342 may be pressed against each other by a compressive force. For example, the compressive force may be generated by fasteners attached through the process connection 314 and the process connection 338. Though illustrated as angled surfaces in FIG. 8B, the sealing surface 220 may be perpendicular to the central axis 224 of the optical probe 200 or any suitable form factor complementary to the mating sealing surface 342 as needed for an operative sealing interface.

Figure 9A:
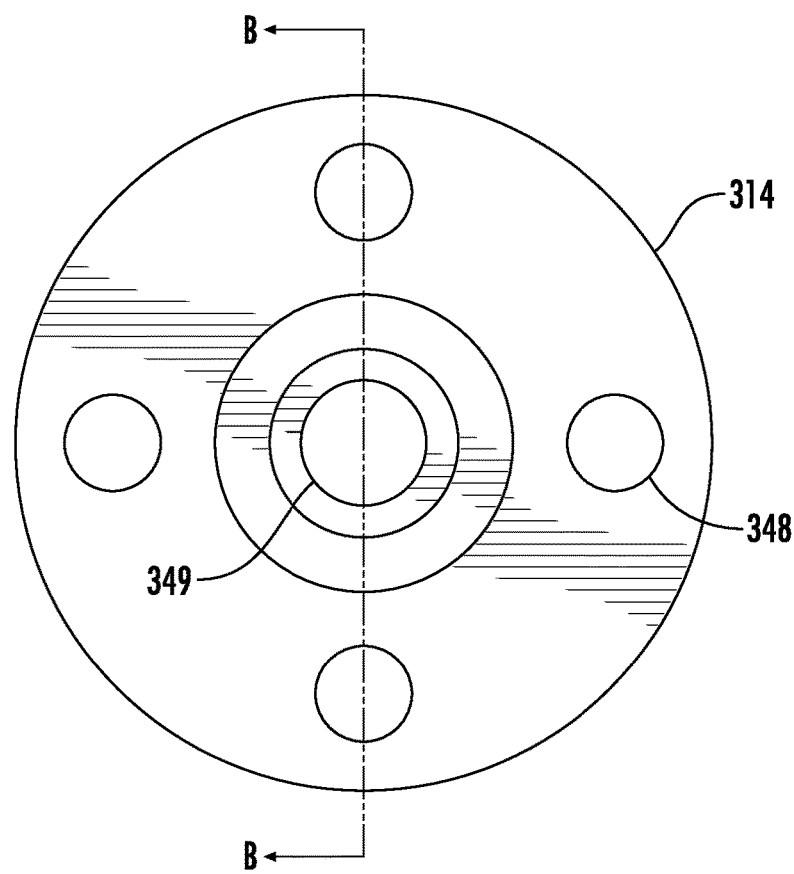
FIG. 9A shows a plan view of the process connection flange.
Figure 9B:
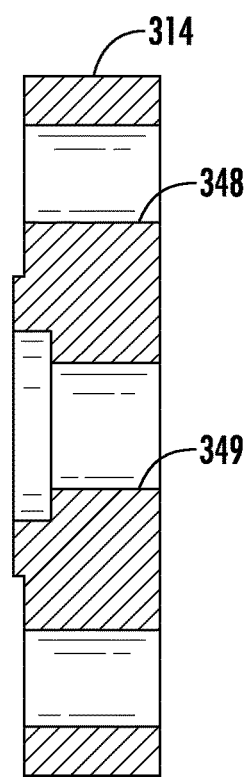
FIG. 9B shows a cross-sectional view of the process connection flange of FIG. 9A at line B-B.

FIG. 9A shows a plan view of the process connection 314 of the probe assembly 300. As shown in FIG. 9A, the process connection 314 may include a plurality of the fastener holes 348 configured for bolts, screws or other suitable fasteners to facilitate attaching the probe assembly 300 to the process container. The process connection 314 may further include a center pass-through hole 349 adapted to enable the optical probe 200 to pass through the process connection 314 and into the process or flow cell 330. In an embodiment, the pass-through hole 349 may further be adapted to enable the optical probe 200 to seat and seal against the process connection 314. FIG. 9B shows a cross-sectional view of the process connection 314 at line B-B of FIG. 9A.

In at least one embodiment of the present disclosure, at least certain components of the optical probe 200, probe assembly 300 and the flow cell 330 may be made of materials capable of withstanding high temperature, high pressure and/or corrosive process conditions that may be present within the process container and/or the measuring chamber 332. For example, as described further herein, the urea synthesis process includes such conditions. In at least one embodiment of the present disclosure, at least certain components of the optical probe 200 and the flow cell 330, for example, components in direct contact with the process and process media (e.g., wetted components), may be manufactured of an austenitic stainless steel, including but not limited to a material meeting ASTM UNS S31050 or AISI 310 MoLN grade stainless steel, having a EN designation X1CrNiMoN25-22-2 or 1.4466. Such an embodiment enables the optical probe 200, and particularly the wetted components of the optical probe 200, to withstand the severe temperature, pressure and corrosive conditions of the urea synthesis process. In an embodiment, the process connection 314, which may not be a wetted component, may be a type 316 stainless steel (for example, type 316L), titanium or other suitable material. Further embodiments may include a material capable of withstanding a corrosive environment at pressures at least between 100 and 300 bar and temperatures in a range of at least 50 to 250° C.

Figure 10:
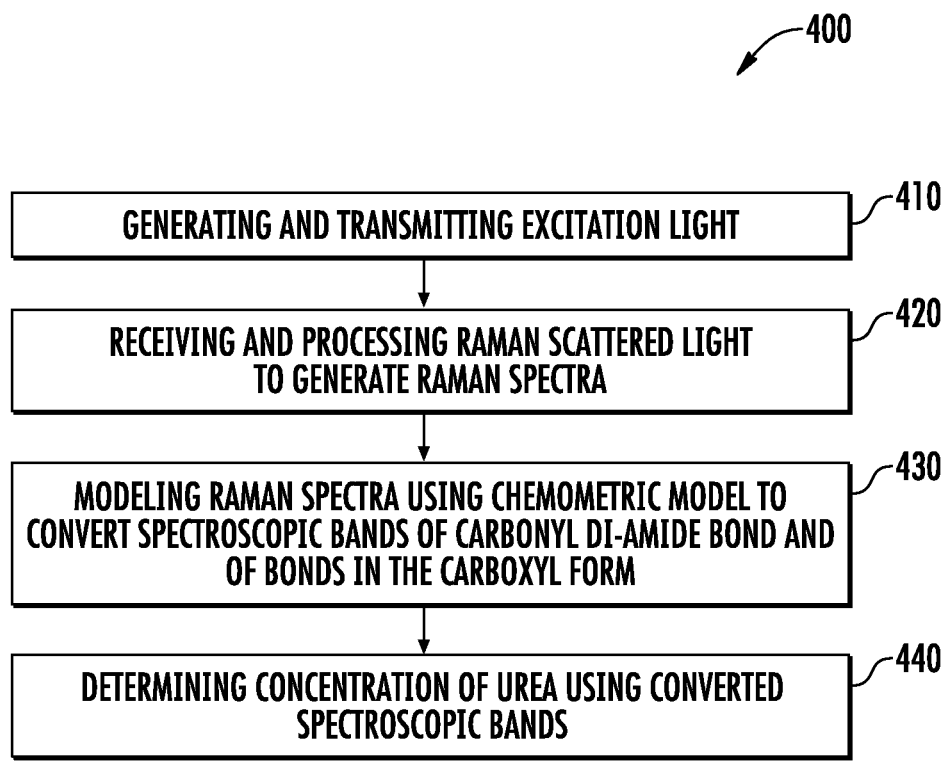
FIG. 10 shows a method of determining a urea concentration according to the present disclosure.

In another aspect of the present disclosure, the spectroscopic system 100 may be adapted to perform a method 400 of the present disclosure for in-line quantitative analysis of at least one process stream of a urea synthesis process, where urea is synthesized from ammonia and carbon dioxide, at a pressure in the range of 100 to 300 bar and temperature in the range of 50 to 250° C. In an embodiment according to FIG. 10, the method 400 includes the use of Raman spectroscopy for such an in-line quantitative analysis. The system 100 may include a spectrometer 110, the probe assembly 300, including the optical probe 200, and computer hardware configured, such as the controller 130, as shown in FIG. 11, to perform operations of the method 400, including a step 410 of generating excitation light and transmitting the excitation light to a process sample of a process stream at a focus region of the optical probe 200. The method 400 may include a step 420 of receiving Raman scattered light at the Raman spectrometer via the probe assembly 300 and the optic cables 2 and processing the Raman scattered light to generate a Raman spectrum.

The method 400 may further include the step 430 of modeling the Raman spectrum using a chemometric model of the present disclosure, the model including a conversion of a spectroscopy band corresponding to excitation of the carbonyl di-amide bond and of a spectroscopy band corresponding to excitation of the atomic bonds in the carboxyl form, where the concentration in the process stream of carbon-containing molecules other than urea and having a carboxyl group is determined by Raman spectroscopy as an equivalent concentration of carbon dioxide corresponding to the excitation of the atomic bonds in the carboxyl form. The chemometric model includes one or more algorithms that use a specific set of data, in the form of Raman spectra, to predict specific quantities and/or characteristics of an underlying processes and/or material. Such algorithms include principal component analysis, multivariate regression, multiple linear regression, partial least squares regression, indirect hard modeling and other suitable statistical methods. In at least one embodiment, the excitation of the carbonyl di-amide bond of molecules of urea is detected from a Raman shift of the excitation light in a frequency range of 900 to 1050 $cm^{-1}$, and the molecules other than urea are detected from a Raman shift of the excitation light in a frequency range of 1000 to 1150 $cm^{-1}$. In an embodiment, the concentration of ammonia is determined from a Raman shift of the excitation light in a frequency range of 1350 to 1750 $cm^{-1}$.

In at least one embodiment, the method 400 may include a step 440 of determining a concentration of urea in the process stream using Raman spectroscopy and through the detection of a spectroscopic band corresponding to excitation of the carbonyl di-amide bond, where the concentration in the process stream of carbon-containing molecules other than urea and having a carboxyl group is determined by Raman spectroscopy as the equivalent concentration of carbon dioxide corresponding to the excitation of the atomic bonds in the carboxyl form. In further embodiments, the method 400 may include providing a spectroscopic system as described, by non-limiting example, herein with respect to the spectroscopic system 100.

In a further aspect of the present disclosure, a computer program product, comprising a non-transitory computer-readable medium storing instructions (e.g., software) stored thereon, is configured such that, when executed by at least one programmable processor, cause the at least one programmable processor to perform operations of the method 400. The term "non-transitory", as used herein, is a limitation of the medium itself (i.e., tangible, not a signal) as opposed to a limitation on data storage persistency (e.g., RAM vs. ROM).

In at least one embodiment, computer program product may include instructions for generating excitation light and transmitting the excitation light to a process sample of a process stream at a focus region of an optical probe 200; receiving and detecting Raman scattered light at the Raman spectrometer via the probe assembly 300 and the optic cables 2 and processing the Raman scattered light to generate a Raman spectrum; modeling the Raman spectrum using a chemometric model of the present disclosure, the model including a conversion of a spectroscopy band corresponding to excitation of the carbonyl di-amide bond and of a spectroscopy band corresponding to excitation of the atomic bonds in the carboxyl form; and determining a concentration of urea in the process stream using Raman spectroscopy and through the detection of the spectroscopic band corresponding to excitation of the carbonyl di-amide bond, where the concentration in the process stream of carbon-containing molecules other than urea and having a carboxyl group is determined by Raman spectroscopy as the equivalent concentration of carbon dioxide corresponding to the excitation of the atomic bonds in the carboxyl form. In at least one implementation, urea is synthesized from ammonia and carbon dioxide using the urea synthesis process at a pressure in the range of 100 to 300 bar and temperature in the range of 50 to 250° C.

While various embodiments of a Raman optical probe, probe assembly, Raman spectroscopic system and methods for using and constructing the same have been described in considerable detail herein, the embodiments are merely offered by way of non-limiting examples of the disclosure described herein. It will therefore be understood that various changes and modifications may be made, and equivalents may be substituted for elements thereof, without departing from the scope of the disclosure. The present disclosure is not intended to be exhaustive or to limit the scope of the subject matter of the disclosure.

Further, in describing representative embodiments, the disclosure may have presented a method and/or process as a particular sequence of steps. However, to the extent that the method or process does not rely on the particular order of steps set forth herein, the method or process should not be limited to the particular sequence of steps described. Other sequences of steps may be possible and thus remain within the scope of the present disclosure.

The invention claimed is:

1. A probe, comprising:
   a probe body having a center axis defining a proximal end and a distal end and including an aperture in the distal end;
   a window affixed in the aperture, wherein the window is substantially optically transparent;
   a flange adjoining the proximal end of the probe body and extending outwardly therefrom, the flange including a sealing surface and a sealing edge, wherein the flange separates an in-process portion of the probe from an ex-process portion of the probe, the in-process portion including at least the probe body, the sealing surface and the sealing edge; and
   a collar adjoining the flange opposite the probe body in the ex-process portion of the probe,
   wherein the probe body, flange and collar define an inner volume therethrough, the inner volume configured to accommodate an optic cable such that the optic cable can pass through the probe body, flange and collar as to be in optical communication with the window, and
   wherein at least the in-process portion of the probe consists essentially of an austenitic stainless steel material, wherein the austenitic stainless steel material meets at least one of: ASTM UNS S31050, AISI 310 MoLN, EN X1CrNiMoN25-22-2 and EN 1.4466.

2. The probe of claim 1, wherein the probe body, flange and collar are manufactured of the same austenitic stainless steel material.

3. The probe of claim 1, wherein the probe body, flange and collar form one, integral part.

4. The probe of claim 1, wherein the ex-process portion of the probe consists essentially of type 316 steel material.

5. The probe of claim 1, further comprising:
a main body having a distal end and a proximal end, the main body defining a channel therethrough, wherein the channel is configured to accommodate at least the proximal end of the probe body into the proximal end of the main body, the channel further configured to enable the optic cable to pass into the main body and connect to the probe body; and
a process connection affixed to the main body at or near the proximal end of the main body, the process connection configured to enable the probe, in assembly, to be attached to a process connector of a process, wherein the flange of the probe seats against the process connection, and
wherein the probe is reversibly attached at or near the proximal end of the main body such that the probe body extends from the main body.

6. The probe of claim 5, further comprising:
a fiber connection including an interlock connected to the distal end of the main body and configured to reversibly attach the optic cable to the probe.

7. The probe of claim 1, wherein the sealing surface is adapted to seal against a complementary surface of a process container or of a flow cell configured to accommodate the probe body.

8. The probe of claim 1, wherein the window is composed of sapphire.

9. A method for in-line quantitative analysis of at least one process stream of a urea synthesis process, the method comprising:
providing a spectroscopic system, comprising:
a narrow band light source adapted to generate excitation light of a suitable wavelength;
an optical probe, the probe including:
a probe body having a center axis defining a proximal end and a distal end and including an aperture in the distal end;
a window affixed in the aperture, wherein the window is substantially optically transparent;
a flange adjoining the proximal end of the probe body and extending outwardly therefrom, the flange including a sealing surface and a sealing edge, wherein the flange separates an in-process portion of the probe from an ex-process portion of the probe, the ex-process portion including at least the probe body, sealing surface and sealing edge; and
a collar adjoining the flange opposite the probe body, wherein the probe body, flange and collar define an inner volume therethrough, the inner volume configured to accommodate an optic cable such that the optic cable can pass through the probe body, flange and collar and be in optical communication with the window, and wherein at least the in-process portion of the probe consists essentially of an austenitic stainless steel material;
a spectrometer configured to generate Raman spectra from scattered light conveyed to the spectrometer via the probe, the spectrometer including a detector;
the optic cable in optical communication between the probe and the spectrometer; and
a processor configured to control the spectroscopic system and to process and analyze the Raman spectra;
generating the excitation light using the light source and transmitting the excitation light via the probe to a process sample of at least one process stream of a urea synthesis process;
detecting the scattered light with the detector of the spectrometer via the probe and processing the scattered light to generate a Raman spectrum;
modeling the Raman spectrum using a chemometric model, the model including a conversion of a spectroscopy band corresponding to excitation of the carbonyl di-amide bond and of a spectroscopy band corresponding to excitation of atomic bonds in the carboxyl form, the modeling performed using the processor; and
determining a concentration of urea in the at least one process stream using the model of the Raman spectrum based on the modeled excitation of the carbonyl di-amide bond, wherein a concentration in the at least one process stream of carbon-containing molecules other than urea and having a carboxyl group is determined using the model of the Raman spectrum as an equivalent concentration of carbon dioxide corresponding to the excitation of the atomic bonds in the carboxyl form, the determining performed using the processor,
wherein urea is synthesized from ammonia and carbon dioxide using the urea synthesis process at a pressure in the range of 100 to 300 bar and a temperature in the range of 50 to 250° C.

10. The method of claim 9, wherein the excitation of the carbonyl di-amide bond of molecules of urea is detected from a Raman shift of the excitation light in a frequency range of 900 to 1050 $cm^{-1}$; and
wherein the carbon-containing molecules other than urea are detected from a Raman shift of the excitation light in a frequency range of 1000 to 1150 cm'.

11. The method of claim 10, wherein the processor is further configured to determine a concentration of ammonia from a Raman shift of the excitation light in a frequency range of 1350 to 1750 $cm^{-1}$.

12. The method of claim 9, wherein the austenitic stainless steel material meets at least one of: ASTM UNS S31050, AISI 310 MoLN, EN X1CrNiMoN25-22-2 and EN 1.4466.

13. The method of claim 9, wherein the probe body, flange and collar are manufactured of the same austenitic stainless steel material.

14. A computer program product comprising a non-transitory, computer-readable medium storing instructions stored thereon that, when executed by at least one programmable processor, cause the at least one programmable processor to perform a Raman spectroscopic analysis by performing operations, comprising:
generating excitation light using a light source and transmitting the excitation light via a probe to a process sample of at least one process stream of a urea synthesis process;
detecting scattered light from the at least one process stream with a detector of a spectrometer via the probe and processing the scattered light to generate a Raman spectrum;

modeling the Raman spectrum using a chemometric model, the model including a conversion of a spectroscopy band corresponding to excitation of the carbonyl di-amide bond and of a spectroscopy band corresponding to excitation of the atomic bonds in the carboxyl form; and determining a concentration of urea in the at least one process stream using the model of the Raman spectrum based on the modeled excitation of the carbonyl di-amide bond, wherein a concentration in the at least one process stream of carbon-containing molecules other than urea and having a carboxyl group is determined by using the model of the Raman spectrum as an equivalent concentration of carbon dioxide corresponding to the excitation of the atomic bonds in the carboxyl form, wherein urea is synthesized from ammonia and carbon dioxide using the urea synthesis process at a pressure in the range of 100 to 300 bar and a temperature in the range of 50 to 250° C.

15. The computer program product of claim 14, wherein the stored instructions include instructions for performing an operation including determining a concentration of ammonia from a Raman shift of the excitation light in a frequency range of 1350 to 1750 $cm^{-1}$.

16. The computer program product of claim 14, wherein the stored instructions include instructions for performing operations including:

determining the concentration of urea from a detected Raman shift of the excitation light in a frequency range of 900 to 1050 $cm^{-1}$ based on the modeled excitation of the carbonyl di-amide bond of molecules of urea; and determining the equivalent concentration of carbon dioxide from a detected Raman shift of the excitation light in a frequency range of 1000 to 1150 $cm^{-1}$ based on the modeled excitation of the atomic bonds in the carboxyl form of the carbon-containing molecules other than of urea.

\* \* \* \* \*